US008947883B2

(12) United States Patent
Upadhyayula et al.

(10) Patent No.: US 8,947,883 B2
(45) Date of Patent: Feb. 3, 2015

(54) LOW PROFILE WIRE BONDED USB DEVICE

(75) Inventors: Suresh Upadhyayula, San Jose, CA (US); Robert C. Miller, San Jose, CA (US); Hem Takiar, Fremont, CA (US); Steven Sprouse, San Jose, CA (US); Ka Ian Yung, Mountain View, CA (US)

(73) Assignee: SanDisk Technologies Inc., Plano, TX (US)

( * ) Notice: Subject to any disclaimer, the term of this patent is extended or adjusted under 35 U.S.C. 154(b) by 646 days.

(21) Appl. No.: 11/965,691

(22) Filed: Dec. 27, 2007

(65) Prior Publication Data

US 2009/0165294 A1 Jul. 2, 2009

(51) Int. Cl.
*H05K 7/00* (2006.01)
*G06K 19/077* (2006.01)
*H01L 23/00* (2006.01)

(52) U.S. Cl.
CPC .... *G06K 19/07743* (2013.01); *G06K 19/07732* (2013.01); *G06K 19/07735* (2013.01); *H01L 24/48* (2013.01); *H01L 24/49* (2013.01); *H01L 24/85* (2013.01); *H01L 2224/48091* (2013.01); *H01L 2224/49171* (2013.01); *H01L 2225/06562* (2013.01); *H01L 2924/01078* (2013.01); *H01L 2924/01079* (2013.01); *H01L 2924/14* (2013.01); *H01L 2924/1433* (2013.01); *H01L 2924/19041* (2013.01); *H01L 2924/19042* (2013.01); *H01L 2924/19043* (2013.01); *H01L 2924/3025* (2013.01); *H01L 2924/01019* (2013.01); *H01L 2224/85* (2013.01)
USPC .......................................... 361/737; 361/777

(58) Field of Classification Search
USPC ......... 361/727, 737, 760–761, 767, 803, 777; 174/776, 777
See application file for complete search history.

(56) References Cited

U.S. PATENT DOCUMENTS 4,532,419 A * 7/1985 Takeda .......................... 235/492
4,766,480 A * 8/1988 Hamada ........................ 257/679
4,814,943 A * 3/1989 Okuaki ......................... 361/783

(Continued)

FOREIGN PATENT DOCUMENTS

JP 2007094718 4/2007
KR 20030066284 A 8/2003
TW 200731275 A 8/2007

OTHER PUBLICATIONS

Korean Office Action dated Feb. 19, 2010 in Korean Patent Application No. 93879/2008.

(Continued)

*Primary Examiner* — Hung S Bui
(74) *Attorney, Agent, or Firm* — Vierra Magen Marcus LLP

(57) ABSTRACT

A low profile USB flash memory device, and methods of forming same, are disclosed. The USB flash memory device includes an integrated circuit memory portion and a USB connector. The memory portion and the USB connector may be integrally formed on the same substrate. The USB flash memory device includes a substrate on which is mounted one or more flash memory die, a controller die, passive components and an LED for indicating when the memory is being accessed. In contrast to prior art USB memory devices which used TSOP packages mounted on a printed circuit board, the semiconductor die of the present invention are affixed to the substrate and wire bonded in a SIP configuration. Omitting the encapsulated TSOP packages allows a reduction in the overall thickness of the USB flash memory device.

37 Claims, 6 Drawing Sheets

(56) References Cited

U.S. PATENT DOCUMENTS

| | | | | |
|---|---|---|---|---|
| 5,564,933 | A * | 10/1996 | Bouchan et al. | 439/76.1 |
| 6,040,622 | A | 3/2000 | Wallace | |
| 6,104,095 | A * | 8/2000 | Shin et al. | 257/787 |
| 6,410,355 | B1 | 6/2002 | Wallace | |
| 6,762,488 | B2 * | 7/2004 | Maeda et al. | 257/686 |
| 6,854,984 | B1 * | 2/2005 | Lee et al. | 439/79 |
| 6,867,485 | B2 | 3/2005 | Wallace | |
| 7,052,287 | B1 * | 5/2006 | Ni et al. | 439/76.1 |
| 7,053,483 | B2 | 5/2006 | Wallace | |
| 7,069,370 | B2 * | 6/2006 | Sukegawa et al. | 710/305 |
| 7,218,528 | B2 * | 5/2007 | Chen | 361/737 |
| 7,249,978 | B1 | 7/2007 | Ni | |
| 7,269,004 | B1 * | 9/2007 | Ni et al. | 361/679.41 |
| 7,352,601 | B1 * | 4/2008 | Minneman et al. | 365/51 |
| 7,518,879 | B2 * | 4/2009 | Chung et al. | 361/737 |
| 7,608,787 | B2 * | 10/2009 | Takemoto et al. | 174/260 |
| 7,709,946 | B2 * | 5/2010 | Ryu et al. | 257/692 |
| 2004/0087213 | A1 * | 5/2004 | Kao | 439/638 |
| 2005/0156333 | A1 * | 7/2005 | Chiou et al. | 257/787 |
| 2005/0181645 | A1 | 8/2005 | Ni et al. | |
| 2006/0180915 | A1 | 8/2006 | Wallace | |
| 2006/0184709 | A1 | 8/2006 | Sukegawa et al. | |
| 2006/0270281 | A1 | 11/2006 | Ho | |
| 2006/0285305 | A1 | 12/2006 | Okumura | |
| 2007/0066102 | A1 | 3/2007 | Takemoto et al. | |
| 2007/0066139 | A1 * | 3/2007 | Roeper et al. | 439/607 |
| 2007/0127223 | A1 * | 6/2007 | Mitsuhashi | 361/752 |
| 2007/0293088 | A1 | 12/2007 | Hiew et al. | |
| 2007/0295982 | A1 | 12/2007 | Ryu et al. | |

OTHER PUBLICATIONS

Office Action dated Dec. 20, 2010 in Korean Patent Application No. 93879/2008.

Response to Office Action filed Nov. 25, 2010 in Chinese Patent Application No. 200810212374.4.

Office Action dated May 21, 2010 in Chinese Patent Application No. 200810212374.4.

Response to Office Action filed Aug. 19, 2010 in Korean Patent Application No. 93879/2008.

Response to Office Action filed Jun. 20, 2011 in Korean Patent Application No. 93879/2008.

Response to Office Action filed Jun. 20, 2011 in Chinese Patent Application No. 200810212374.4.

Office Action dated Jun. 23, 2011 in Chinese Patent Application No. 200810212374.4.

Office Action dated Feb. 21, 2012 in Taiwan Patent Application No. 097135626.

English translation of Abstract for Publication No. TW200731275 published Aug. 16, 2007.

Demand for Appellate Trial dated Mar. 20, 2012 in Korean Patent Application No. 10-2008-0093879.

Amendment dated Apr. 19, 2012 in Korean Patent Application No. 10-2008-0093879.

Supplement for Appellate Trial Against Decision of Rejection dated Apr. 19, 2012 in Korean Patent Application No. 10-2008-0093879.

Decision of Rejection dated Dec. 20, 2011 Jun. 20, 2011 in Korean Patent Application No. 93879/2008.

Response to Office Action filed Aug. 20, 2012 in Taiwan Patent Application No. 097135626.

* cited by examiner

Fig. 9
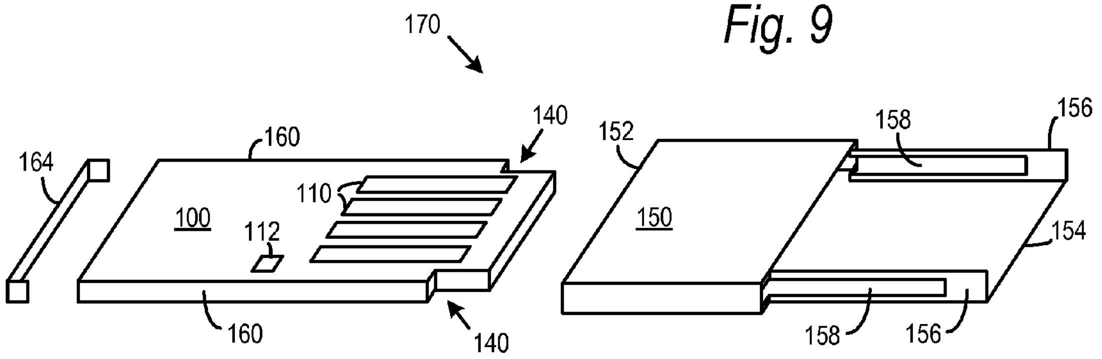
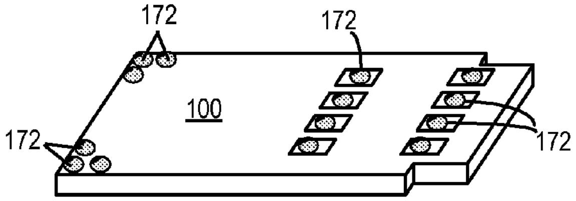
Fig. 10
Fig. 11
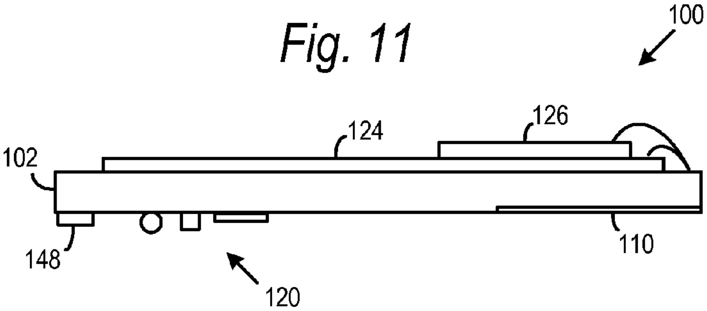

LOW PROFILE WIRE BONDED USB DEVICE

BACKGROUND OF THE INVENTION

1. Field of the Invention

Embodiments of the present invention relate to low profile USB device and in particular to a USB device formed as a SIP module.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large storage capacity, have made such memory devices ideal for use in a wide variety of electronic devices, including for example digital cameras, digital music players, video game consoles, PDAs and cellular telephones.

Equally ubiquitous is the universal serial bus (USB) interface for transferring signals between devices such as those named above and other components such as for example desktop computers and the like. A typical USB storage device includes a memory portion coupled to a USB connector capable of mating within a USB slot of a host device. The memory portion typically includes a printed circuit board on which are mounted one or more flash memory chips, a controller, passive components and an LED for indicating when the memory is being accessed. While there are several types of USB connectors, the most commonly used is the type-A plug on which is a 4-pin connector, surrounded by a shield. A conventional type-A USB plug includes a base on which is formed a signal power pin, a pair of signal pins and a signal ground pin. During a conventional fabrication process, the USB connector may be affixed to the memory portion, as by welding and/or soldering, and the memory portion and connector may then be covered by the shield.

When fabricating the memory portion of conventional USB memory device, TSOP memory and/or controller packages are surface mounted to the printed circuit board. After this step, the memory portion is then typically encased within a molding compound of epoxy resin in an overmolding process to seal and protect the memory portion. Examples of USB devices formed in this way using TSOP packages are disclosed for example in U.S. Patent Application Publication No. US 2006/0184709, entitled, "USB Memory Storage Apparatus," and U.S. Pat. No. 7,249,978, entitled, "Reduced-Length, Low-Profile USB Device and Card-Like Carrier." USB memory devices such as those described above have a large thickness owing to the fact that, with the TSOP packages, the devices include an overmolded package mounted within an overmolded package.

SUMMARY OF THE INVENTION

Embodiments of the present invention relate to a semiconductor device including a low profile USB flash memory device, and methods of forming same. The USB flash memory device includes an integrated circuit memory portion and a USB connector. In embodiments, both the memory portion and the USB connector are integrally formed on the same substrate.

The USB flash memory device includes a substrate on which is mounted one or more flash memory die, a controller die, passive components and an LED for indicating when the memory is being accessed. In contrast to prior art USB memory devices which used TSOP packages mounted on a printed circuit board, the semiconductor die of the present invention are affixed to the substrate and wire bonded in a SIP configuration. Omitting the encapsulated TSOP packages allows a reduction in the overall thickness of the USB flash memory device.

In embodiments, a finished USB memory device may be sheathed within a cover and used as a removable USB flash memory assembly within a host device. In alternative embodiments, the cover may be omitted, and the USB flash memory device may be used in an embedded application where the device is permanently affixed to a motherboard of a host device. In such embodiments, solder bumps may be provided on the USB pins so that the device may be permanently affixed within the host device by mating the solder bumps with contact pads on the host device motherboard and then curing the solder bumps in a reflow process.

DESCRIPTION OF THE DRAWINGS

FIG. 9 is a perspective view of a memory device and cover according to an embodiment of the present invention.

FIG. 10 is a perspective view of a memory device including solder bumps for permanently affixing the device to a motherboard according to an alternative embodiment.

FIG. 11 is a side view of an alternative embodiment of the present invention including semiconductor die mounted on a first side of the substrate and components mounted on an opposite side of the substrate

DETAILED DESCRIPTION

Embodiments will now be described with reference to FIGS. 1 through 12, which relate to a low profile USB memory device. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
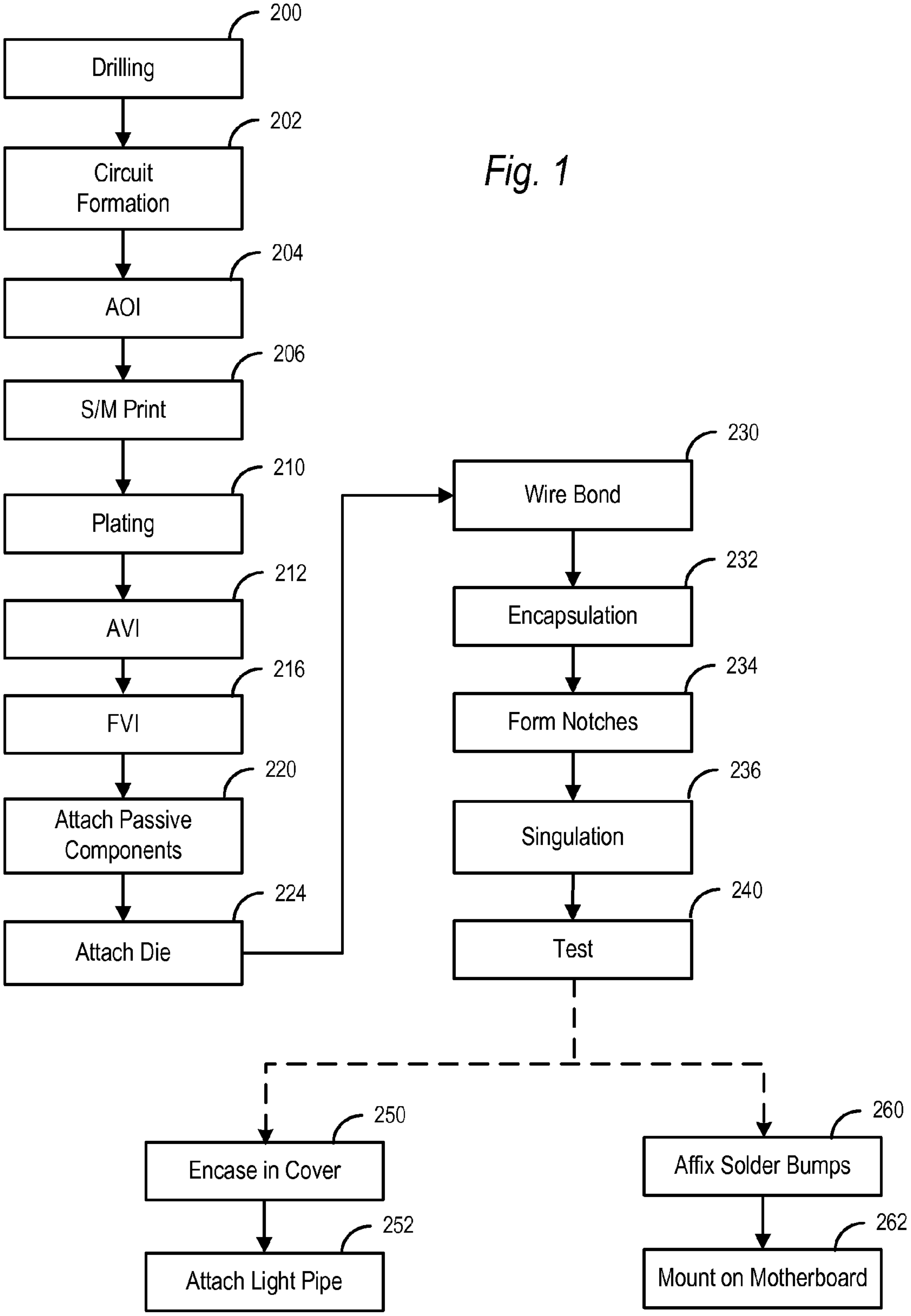
FIG. 1 is a flowchart of the overall fabrication process of semiconductor package according to embodiments of the present invention.
Figure 2:
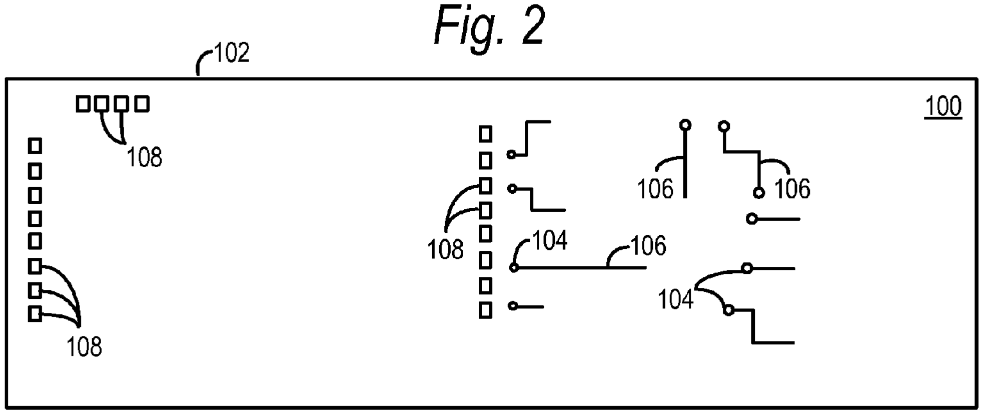
FIG. 2 is a top view of an embodiment of a USB memory device at a first step in the fabrication process including a conductance pattern formed on the device.
Figure 3:
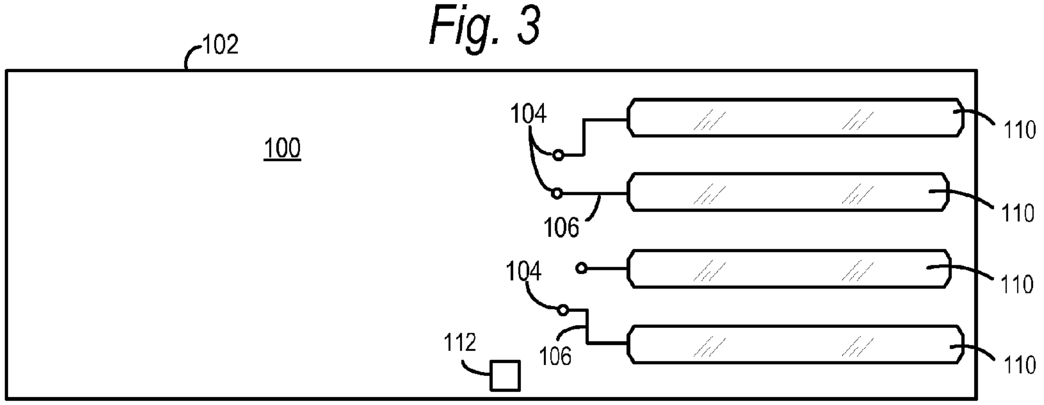
FIG. 3 is a bottom view of an embodiment of a USB memory device at a first step in the fabrication process including a conductance pattern and connector pins formed on the device.

An embodiment of the present invention will now be explained with reference to the flowchart of FIG. 1 and the top and bottom views of FIGS. 2 through 8. Although FIGS. 2 through 8 each show an individual USB flash memory device 100, or a portion thereof, it is understood that the device 100 may be batch processed along with a plurality of other devices 100 on a substrate panel to achieve economies of scale. The number of rows and columns of devices 100 on the substrate panel may vary.

The substrate panel begins with a plurality of substrates 102 (again, one such substrate is shown in FIGS. 2 through 8). The substrate 102 may be a variety of different chip carrier mediums, including a printed circuit board (PCB), a leadframe or a tape automated bonded (TAB) tape. Where substrate 102 is a PCB, the substrate may be formed of a core having a top conductive layer and a bottom conductive layer. The core may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core may be ceramic or organic in alternative embodiments.

The conductive layers surrounding the core may be formed of copper or copper alloys, plated copper or plated copper alloys, copper plated steel, or other metals and materials known for use on substrate panels. The conductive layers may have a thickness of about 10 μm to 25 μm, although the thickness of the layers may vary outside of that range in alternative embodiments.

In a step 200, the substrate 102 is drilled to define through-hole vias 104 in the substrate 102. The vias 104 shown are by way of example, and the substrate may include many more vias 104 than is shown in the figures, and they may be in different locations than is shown in the figures. Conductance patterns are next formed on one or both of the top and bottom conductive layers in step 202. The conductance pattern(s) may include electrical traces 106 and contact pads 108. The traces 106 and contact pads 108 shown are by way of example, and the substrate 102 may include more traces and/or contact pads than is shown in the figures, and they may be in different locations than is shown in the figures. The conductance pattern on the top and/or bottom surfaces of the substrate 102 may be formed by a variety of known processes, including for example various photolithographic processes.

In embodiments, the USB connector may be formed integrally with the memory portion of the USB memory device 100. Accordingly, in embodiments, the conductance pattern may also define connector pins 110 as shown in the bottom view of FIG. 3. Alternatively, it is understood that connector pins 110 may be formed independently of substrate 102 and mounted on substrate 102 thereafter. The connector pins 110 shown are for a type-A USB connection to a host device, but it is contemplated that other types of USB connector pins may be included in the present invention. As is also shown on FIG. 3, a ground pad 112 may also be provided on substrate 102 for grounding the USB memory device 100 to a USB slot as explained hereinafter.

Referring again to FIG. 1, the substrate 102 may next be inspected in an automatic optical inspection (AOI) in step 204. Once inspected, a solder mask may be applied to the substrate in step 206 leaving the contact pads 108 and connector pins 110 exposed. After the solder mask is applied, the contact pads 108, connector pins 110 (if formed in the conductance pattern) and any other solder areas on the conductance patterns may be plated with a Ni/Au or the like in step 210 in a known electroplating or thin film deposition process. The substrate 102 may then be inspected and tested in an automated inspection process (step 212) and in a final visual inspection (step 216) to check electrical operation, and for contamination, scratches and discoloration.

Figure 4:
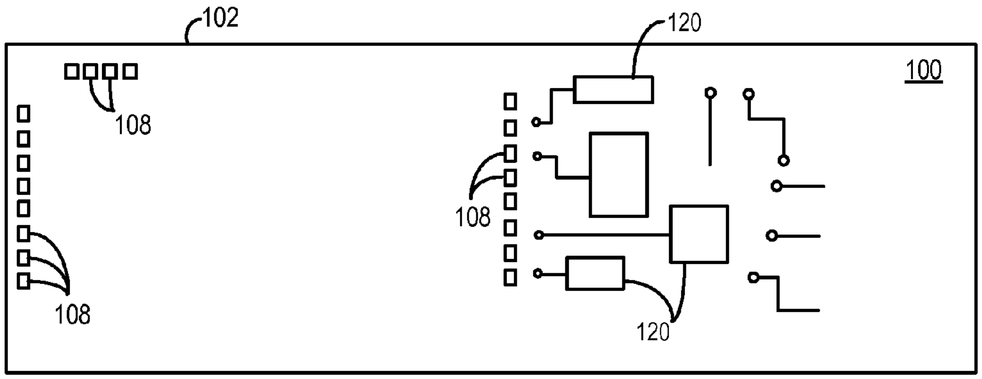
FIG. 4 is a top view of an embodiment of a USB memory device at a second step in the fabrication process including passive components mounted on the device.

Assuming the substrate 102 passes inspection, passive components 120 may next be affixed to the top surface of the substrate 102 in a step 220 as shown in FIG. 4. The one or more passive components 120 may be mounted on the substrate 102 and electrically coupled to the conductance pattern as by connection to contact pads (not shown) in known surface mount and reflow processes. The passive components 120 may include for example one or more capacitors, resistors and/or inductors, though other components are contemplated. An LED may also be mounted to the substrate and permanently affixed during a reflow process. The LED may activate when the below-described flash memory is accessed during use of the USB flash memory device.

Figure 5:
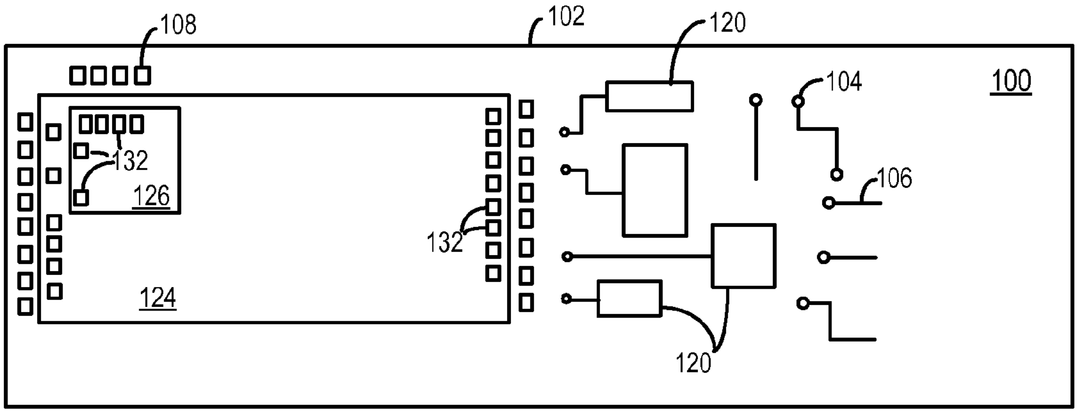
FIG. 5 is a top view of an embodiment of a USB memory device at a third step in the fabrication process including semiconductor die mounted on the device.

Referring now to the top view of FIG. 5, one or more semiconductor die may next be affixed to the top surface of the substrate 102 in a step 224. The embodiment of FIG. 5 includes a flash memory die 124 and a controller die 126. The memory die 124 may be for example flash memory chips (NOR/NAND), though other types of memory die are contemplated. Controller die 126 may for example be an ASIC. While a single memory die 124 is shown, it is understood that a plurality of memory die may be included. In accordance with the present invention, instead of being TSOP packages, the die 124, 126 may be mounted directly to the substrate 102. Mounting the passive components and die directly on the substrate in a SIP (System in Package) arrangement allows a reduction in the height of the finished USB memory device as compared to devices using TSOP semiconductor die packages.

Figure 6:
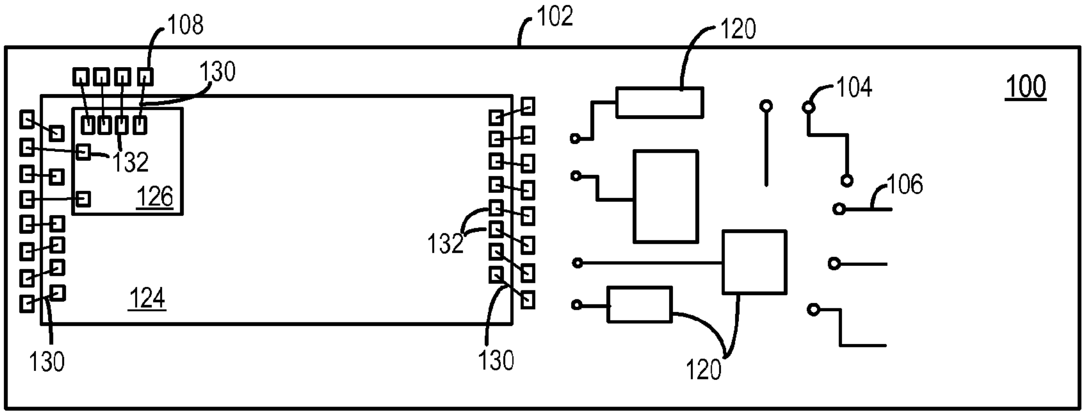
FIG. 6 is a top view of an embodiment of a USB memory device at a fourth step in the fabrication process including semiconductor die wire bonded to the device

Referring now to FIG. 6, after the die 124, 126 have been mounted on the substrate, the die may be electrically coupled to the substrate via wire bonds 130 in step 230. The wire bonds 130 may be connected between die bond pads 132 on the die 124, 126 and the contact pads 108 on the substrate 102. The controller die 126 is shown stacked atop the memory die 124, but it is understood that both of the die 124 and 126 may be mounted directly to the substrate 102 in alternative embodiments. Moreover, while the die 124, 126 are shown mounted on the same side of the substrate and connector pins 110, it is understood that one or both of the die 124 and 126 may be mounted on an opposite surface of the substrate 102 than the pins 110 in alternative embodiments. Where mounted on the opposite surface, contact pads 108 would also be mounted on the opposite surface to allow electrical coupling of the die 124, 136 to the substrate 102.

Figure 7:
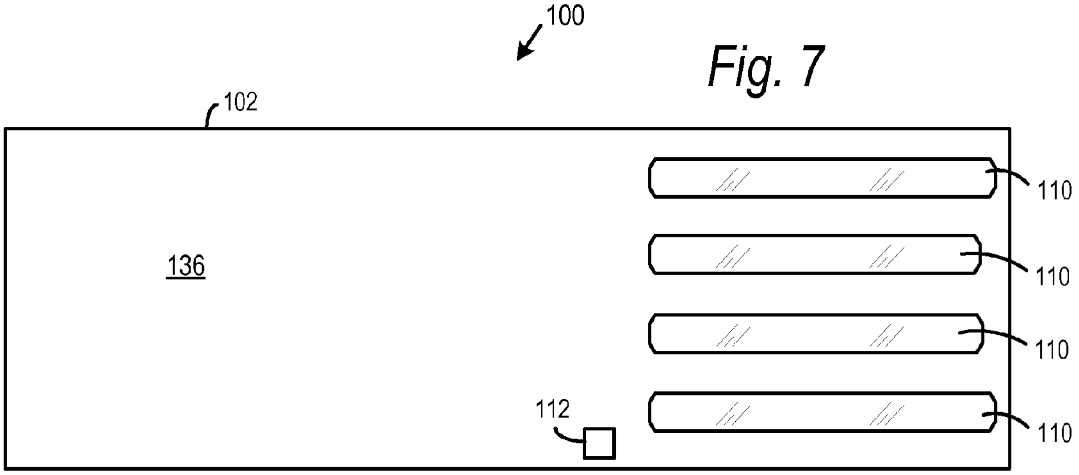
FIG. 7 is a bottom view of an embodiment of a USB memory device at a fifth step in the fabrication process including overmolding of the device.

Referring now to the bottom view of FIG. 7, in embodiments, after the die 124, 126 are coupled to substrate 102, the substrate and die may be encapsulated in a molding compound 136 in step 232 to form a USB flash memory device 100. Although not critical to the present invention, the molding compound 136 may be an epoxy resin such as for example available from Sumito Corp. or Nitto Denko Corp., both having headquarters in Japan. Other molding compounds from other manufacturers are contemplated. The molding compound may be applied according to various processes, including by transfer molding or injection molding techniques. The molding compound covers at least the passive components 120, the memory die 124 and the controller die 126. The connector pins 110 may be left uncovered and exposed so that they may be mated with terminals in a host device. Ground pads 112 may also be left uncovered and exposed. In embodiments, the USB flash memory device 100 may have a thickness of less than 1 mm.

Figure 8:
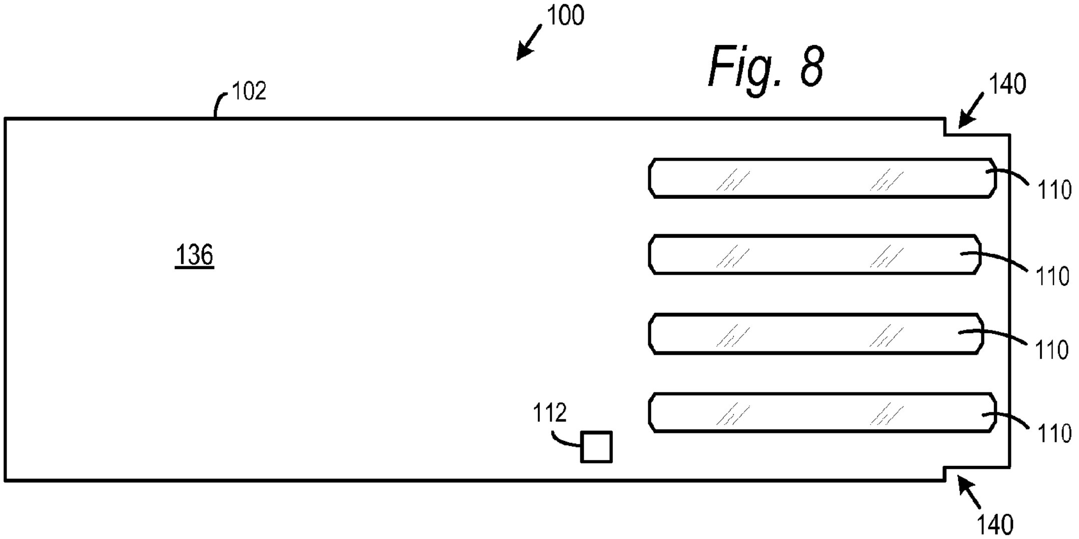
FIG. 8 is a bottom view of an embodiment of a USB memory device at a sixth step in the fabrication process including the formation of notches at the front corners of the device.
Figure 12:
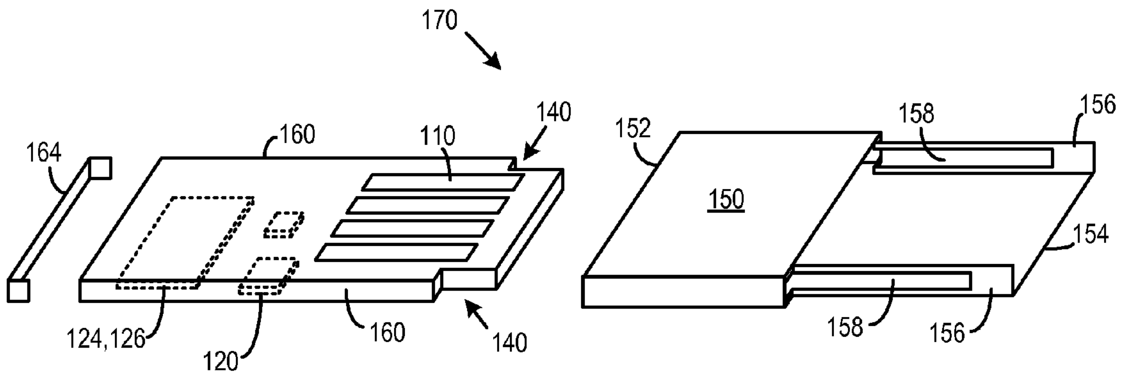
FIG. 12 is a perspective view of a memory and cover according to a further alternative embodiment of the present invention.

As shown in FIG. 8, after the overmolding process, notches 140 may be formed in step 234 at the front corners of the device 100, adjacent the connector pins 110. The notches 140 are formed to allow the device 100 to be inserted into a cover as explained hereinafter. The notches may be formed by various processes, such as for example by laser cutting or cutting by saw blade, water jet or other cutting methods.

After the USB flash memory devices 100 on the panel have been notched in step 234, the respective devices may be singulated in step 236 from the panel to form the finished USB flash memory device 100 shown in FIG. 8. Each device 100 may be singulated by any of a variety of cutting methods including sawing, water jet cutting, laser cutting, water guided laser cutting, dry media cutting, and diamond coating wire cutting. While straight line cuts will define generally rectangular or square shaped device 100, it is understood that device 100 may have shapes other than rectangular and square in further embodiments of the present invention.

Once cut into devices 100, the devices may be tested in a step 240 to determine whether the packages are functioning properly. As is known in the art, such testing may include electrical testing, burn in and other tests.

Referring now to FIG. 9, in embodiments, a singulated USB flash memory device 100 may be mounted within a cover 150 in a step 250 to form a USB flash memory assembly 170. The cover 150 includes a sealed back end 152 for protecting the memory portions of the device 100, and an open end 154 so that the connector pins 110 may remain exposed. The sides 156 of cover 150 at the front end may include slots 158 for receiving the outer edge 160 of the USB flash memory device 100. When the device 100 is fully seated within cover 150, the notches 140 seat against the forward edge of slots 158. A light pipe 164 as is known in the art may be affixed to a back end of device 100 in step 252 for diffusing light from the LED mounted on the substrate.

The USB flash memory assembly 170 may be removably inserted within a USB port and used with a host device to exchange data between the memory die 124 in the device 100 and the host device. In embodiments, the device 100 may be electrically coupled to the cover 150 to allow grounding of the device 100 through the cover 150 when the USB flash memory assembly 170 is inserted within a USB port of a host device. In particular, lid 152 may include a leaf spring or finger (not shown) formed of metal which contacts ground pad 112 defined on substrate 102 when the USB device 100 is inserted into lid 152. The pad 112 and finger in lid 152 provide a ground path for static dissipation to the USB port of the host device.

In an alternative embodiment shown in FIG. 10 (and indicated by the dashed lines on the flowchart of FIG. 1), the USB flash memory device 100 may be used in an embedded application where the device 100 is permanently affixed to a motherboard (not shown) of a host device. In the embodiment of FIG. 10, the cover 150 may be omitted, and connector pins 110 may be omitted. Solder in the form of solder bumps 172 or a solder paste may be applied to contact pads formed in the place of the connector pins in the embodiment of FIG. 10 in a step 260. While two rows of solder bumps are shown, there may be a single row or more than two rows in alternative embodiments. In a step 262, the solder bumps 172 may then be surface mounted to contact pads on the host device motherboard, and reflowed for example by ultrasonic welding to permanently affix and electrically couple the device 100 to the motherboard. Thereafter, device 100 may be used as a permanent memory storage resource for the host device. Additional solder bumps 172 may optionally be provided at other portions of the device 100 to add structural support to the device 100 when it gets affixed to the motherboard.

An advantage of the USB flash memory device 100 is that it may be fabricated the same way for use in either the embodiment of FIG. 9 or the embodiment of FIG. 10. However, where the device 100 is used in the embodiment of FIG. 10, the notches 140 may be omitted in alternative embodiments.

In the above-described embodiments, the semiconductor die 124, 126 have been shown mounted on the same side of the substrate as the other components (the passive components 120 and LED). In a further embodiment of the present invention shown in FIG. 11, the semiconductor die 124, 126 may be mounted on a first side of the substrate 102 and the components such as passive component 120 and LED 148 may be mounted on the opposite side of the substrate 102. In this embodiment, the passive components 120 and LED 148 may be mounted on the same side as pins 110. By placing the passive components and LED on a side of the substrate opposite the semiconductor die 124, 126, the size of die 124 and/or 126 to be increased to increase the storage capacity and/or functionality of the device 100. The device 100 of FIG. 11 may be fabricated by affixing the passive components and LED to the substrate 102 in surface mount and reflow process. Thereafter, the semiconductor die 124, 126 may be mounted and wire bonded as described above. The device 100 may then be encapsulated in a mold compound (not shown in FIG. 11).

In the embodiment shown in FIG. 9, the device 100 is encapsulated within a molding compound 136. In a further embodiment of the present invention shown in FIG. 12, a USB flash memory device 100 may be fabricated as described above, but the encapsulation step may be omitted. This provides an even thinner device 100. Notches 140 may be cut within substrate 102 as described above with respect to the notches formed within the molding compound 136. The device 100 may be inserted into a cover 150 so that the notches 140 in the substrate 102 seat against the edges of slots 158 when the device 100 is fully inserted within the cover. The cover 150 may be as described above, but may in embodiments have a thinner profile given the reduced thickness of the device 100 in FIG. 12 relative to the thickness of the device 100 in FIG. 9.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A USB flash memory device, comprising:

a substrate;

a conductance pattern defined on a surface of the substrate;

USB connector pins formed in the conductance pattern on the substrate for removable insertion into a host device and for electrically coupling the USB flash memory device with the host device when inserted into the host device;

one or more semiconductor die, the one or more semiconductor die including die bond pads on an upper surface of the one or more semiconductor die;

wire bonds formed between the die bond pads on the one or more semiconductor die and the substrate;

molding compound encapsulating the one or more semiconductor die and wire bonds.

2. The USB flash memory device as recited in claim 1, further comprising a cover within which the substrate and one or more semiconductor die are mounted, the cover leaving the connector pins exposed and capable of mating with terminals within a slot of a host device.

3. The USB flash memory device as recited in claim 1, further comprising solder bumps for permanently affixing the USB flash memory device to a motherboard of a host device.

4. The USB flash memory device as recited in claim 1, wherein the one or more semiconductor devices are mounted to the same surface of the substrate including the connector pins.

5. The USB flash memory device as recited in claim 1, wherein the one or more semiconductor devices are mounted to the opposite surface of the substrate than that including the connector pins.

6. The USB flash memory device as recited in claim 1, further comprising an LED mounted to the substrate.

7. The USB flash memory device as recited in claim 6, further comprising a light pipe for diffusing the light emitted by the LED.

8. The USB flash memory device as recited in claim 1, wherein the one or more semiconductor die comprise a flash memory die.

9. The USB flash memory device as recited in claim 1, wherein the one or more semiconductor die comprise a controller die.

10. A USB flash memory device, comprising:

a substrate;

a conductance pattern defined on a surface of the substrate;

USB connector pins formed in the conductance pattern on the substrate for removable insertion into a host device and for electrically coupling the USB flash memory device with the host device when inserted into the host device;

one or more semiconductor die, the one or more semiconductor die including die bond pads on a surface of the one or more semiconductor die;

wire bonds formed between the die bond pads on the one or more semiconductor die and the substrate;

molding compound encapsulating the one or more semiconductor die and wire bonds.

11. The USB flash memory device as recited in claim 10, further comprising a cover within which the substrate and one or more semiconductor die are mounted, the cover leaving the connector pins exposed and capable of mating with terminals within a slot of a host device.

12. The USB flash memory device as recited in claim 10, further comprising solder bumps for permanently affixing the USB flash memory device to a motherboard of a host device.

13. The USB flash memory device as recited in claim 10, wherein the one or more semiconductor devices are mounted to the same surface of the substrate including the connector pins.

14. The USB flash memory device as recited in claim 10, wherein the one or more semiconductor devices are mounted to the opposite surface of the substrate than that including the connector pins.

15. The USB flash memory device as recited in claim 10, wherein the one or more semiconductor die comprise a flash memory die.

16. The USB flash memory device as recited in claim 10, wherein the one or more semiconductor die comprise a controller die.

17. The USB flash memory device as recited in claim 10, further comprising an LED mounted to the substrate.

18. The USB flash memory device as recited in claim 17, further comprising a light pipe for diffusing the light emitted by the LED.

19. A USB flash memory device, comprising:

a substrate;

a conductance pattern defined on a surface of the substrate;

USB connector pins formed in the conductance pattern on the substrate for removable insertion into a host device and for electrically coupling the USB flash memory device with the host device when inserted into the host device;

a flash memory semiconductor die including die bond pads;

wire bonds formed between the die bond pads on the flash memory semiconductor die and the substrate;

molding compound encapsulating the flash memory die and wire bonds.

20. The USB flash memory device as recited in claim 19, further comprising a cover within which the substrate and one or more semiconductor die are mounted, the cover leaving the connector pins exposed and capable of mating with terminals within a slot of a host device.

21. The USB flash memory device as recited in claim 19, further comprising solder bumps for permanently affixing the USB flash memory device to a motherboard of a host device.

22. The USB flash memory device as recited in claim 19, wherein the one or more semiconductor devices are mounted to the same surface of the substrate including the connector pins.

23. The USB flash memory device as recited in claim 19, wherein the one or more semiconductor devices are mounted to the opposite surface of the substrate than that including the connector pins.

24. The USB flash memory device as recited in claim 19, further comprising an LED mounted to the substrate.

25. The USB flash memory device as recited in claim 24, further comprising a light pipe for diffusing the light emitted by the LED.

26. A USB flash memory device, comprising:

a substrate;

a conductance pattern defined on a surface of the substrate;

USB connector pins formed in the conductance pattern on the substrate for removable insertion into a host device and for electrically coupling the USB flash memory device with the host device when inserted into the host device;

a flash memory semiconductor die including a first set of die bond pads;

a first set of wire bonds formed between the first set of die bond pads on the flash memory semiconductor die and the substrate;

a controller semiconductor die including a second set of die bond pads;

a second set of wire bonds formed between the second set of die bond pads on the controller semiconductor die and the substrate;

molding compound encapsulating the flash memory and controller semiconductor die and first and second sets of wire bonds.

27. The USB flash memory device as recited in claim 26, further comprising a cover within which the substrate and one or more semiconductor die are mounted, the cover leaving the connector pins exposed and capable of mating with terminals within a slot of a host device.

28. The USB flash memory device as recited in claim 26, further comprising solder bumps for permanently affixing the USB flash memory device to a motherboard of a host device.

29. The USB flash memory device as recited in claim 26, wherein the one or more semiconductor devices are mounted to the same surface of the substrate including the connector pins.

30. The USB flash memory device as recited in claim 26, wherein the one or more semiconductor devices are mounted to the opposite surface of the substrate than that including the connector pins.

31. The USB flash memory device as recited in claim 26, further comprising an LED mounted to the substrate.

32. The USB flash memory device as recited in claim 31, further comprising a light pipe for diffusing the light emitted by the LED.

33. A USB flash memory device, comprising:

a substrate including a conductive layer;

contact pads defined in the conductive layer for electrically connecting to components mounted on the substrate;

USB connector pins defined in the conductive layer for electrically coupling the USB flash memory device with host device when the USB flash memory device is inserted into the host device;

one or more semiconductor die, the one or more semiconductor die including die bond pads on a surface of the one or more semiconductor die;

wire bonds formed between the die bond pads on the one or more semiconductor die and the contact pads on the substrate;

molding compound encapsulating the one or more semiconductor die and wire bonds.

34. The USB flash memory device as recited in claim 33, wherein the one or more semiconductor die comprise a flash memory die.

35. The USB flash memory device as recited in claim 33, wherein the one or more semiconductor die comprise a controller die.

36. The USB flash memory device as recited in claim 33, further comprising an LED mounted to the substrate.

37. The USB flash memory device as recited in claim 36, further comprising a light pipe for diffusing the light emitted by the LED.

* * * * *